US011828805B2

(12) United States Patent
Manson et al.

(10) Patent No.: US 11,828,805 B2
(45) Date of Patent: Nov. 28, 2023

(54) CONDITION-BASED MONITORING SYSTEMS, METHODS, AND APPARATUSES

(71) Applicant: Schweitzer Engineering Laboratories, Inc., Pullman, WA (US)

(72) Inventors: Scott M. Manson, Moscow, ID (US); Ellery A. Blood, Moscow, ID (US); Gregory C. Zweigle, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 36 days.

(21) Appl. No.: 17/319,412

(22) Filed: May 13, 2021

(65) Prior Publication Data

US 2022/0365137 A1  Nov. 17, 2022

(51) Int. Cl.
*G01R 31/34* (2020.01)
*H02P 9/00* (2006.01)

(52) U.S. Cl.
CPC ......... *G01R 31/343* (2013.01); *G01R 31/346* (2013.01); *H02P 9/008* (2013.01)

(58) Field of Classification Search
CPC ...... G01R 31/343; G01R 31/346; H02P 9/008
See application file for complete search history.

(56) References Cited

U.S. PATENT DOCUMENTS

| | | | | |
|---|---|---|---|---|
| 4,258,424 A * | 3/1981 | Giras | ...................... | F01D 17/04 60/660 |
| 4,751,438 A * | 6/1988 | Markunas | .................. | H02P 6/06 318/400.14 |
| 8,792,217 B2 | 7/2014 | Shah | | |
| 9,898,062 B2 | 2/2018 | Shah | | |
| 2004/0099050 A1 * | 5/2004 | Matsiev | ............... | G01N 29/348 73/61.45 |
| 2012/0059537 A1 * | 3/2012 | Hendrickson | ........... | H02M 7/44 903/902 |
| 2012/0063039 A1 * | 3/2012 | Shah | ................... | G06F 11/0793 361/20 |

(Continued)

FOREIGN PATENT DOCUMENTS

| | | | | |
|---|---|---|---|---|
| CA | 2258435 | * | 7/1999 | ............. F01M 11/00 |
| CA | 2701222 | * | 4/2009 | ............ B60W 10/00 |

(Continued)

OTHER PUBLICATIONS

Binh Le Khac; Tuma J. "Diagnostic Internal Combustion Engine Based on Crankshaft Angular Acceleration" Oct. 14, 2011.

(Continued)

*Primary Examiner* — Alexander Satanovsky
*Assistant Examiner* — Sharah Zaab
(74) *Attorney, Agent, or Firm* — Stoel Rives LLP; Richard M. Edge

(57) ABSTRACT

A condition-based monitoring system receives a plurality of measurements from sensors measuring mechanical and electrical aspects of a prime mover and a synchronous machine. The condition-based monitoring system determines a correlation between the mechanical measurements and electrical measurements to estimate parameters of the model. The condition-based monitoring system also updates the model as sensors obtain additional measurements during operation of the prime mover.

19 Claims, 5 Drawing Sheets

(56) References Cited

U.S. PATENT DOCUMENTS

2013/0200389 A1* 8/2013 Lee ................ H01L 29/201
                                              438/285
2014/0359351 A1  12/2014 Shah
2017/0088193 A1*  3/2017 Heil ................ G01M 9/06

FOREIGN PATENT DOCUMENTS

| CN | 102246408    | * | 11/2011 | ............ F02G 1/043 |
| CN | 109751198    | * | 5/2019  | ............ F03D 17/00 |
| EP | 3156861      | * | 4/2017  | ............ G05B 17/02 |
| JP | 2004350982   | * | 12/2004 | ............ D06F 58/28 |
| WO | WO2017051155 | * | 3/2017  | ............ F01M 5/00  |

OTHER PUBLICATIONS

Lutowicz, Marek: "Unsteady Angular Speed of Diesel Engine Crankshaft Preliminary Examination" 2012.

* cited by examiner

CONDITION-BASED MONITORING SYSTEMS, METHODS, AND APPARATUSES

TECHNICAL FIELD

The present disclosure relates to modeling, protecting, and monitoring electrical power generation systems.

BRIEF DESCRIPTION OF THE SEVERAL VIEWS OF THE DRAWINGS

Non-limiting and non-exhaustive embodiments of the disclosure are described herein, including various embodiments of the disclosure with reference to the figures listed below.

Figure 1:
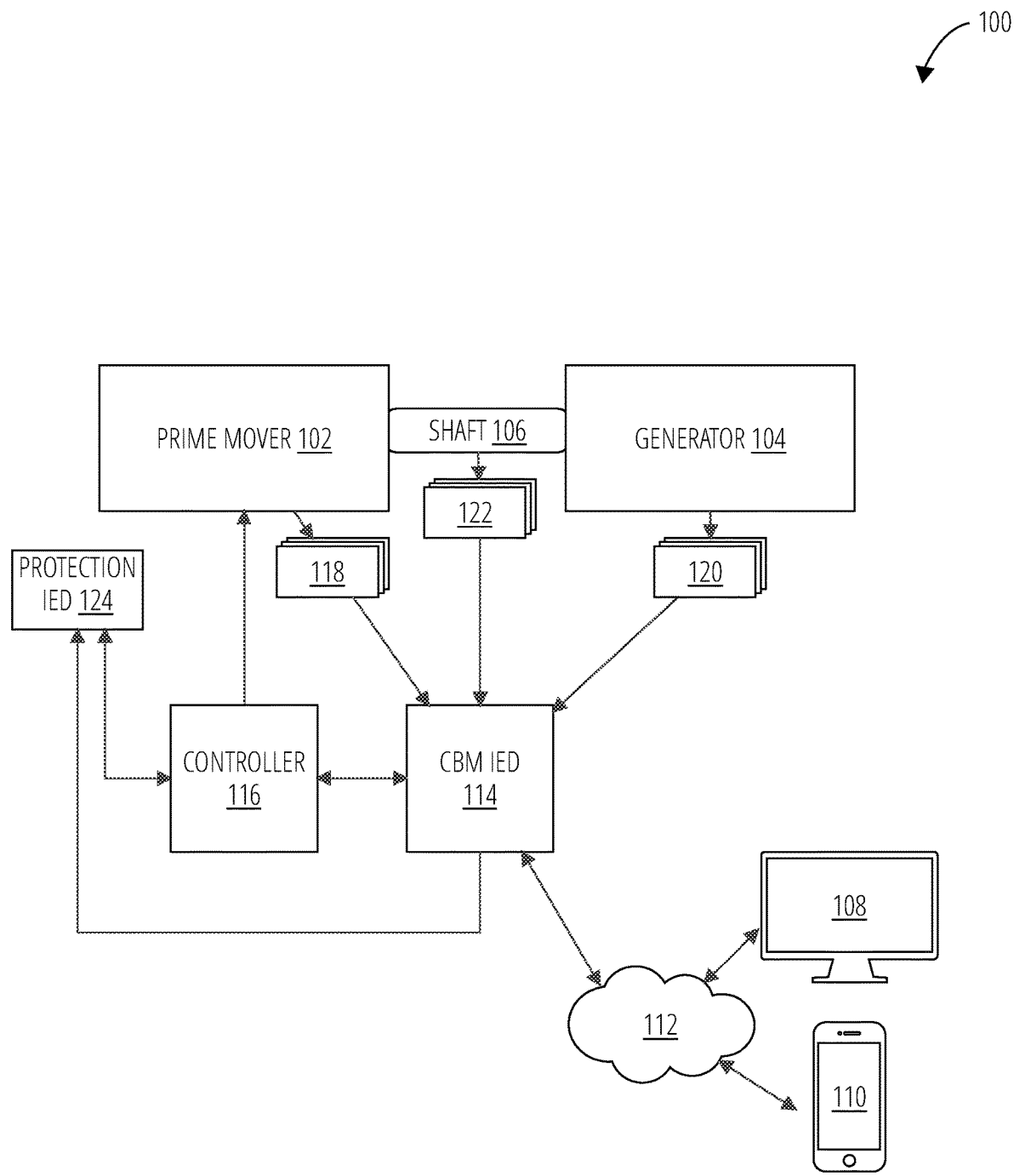
FIG. 1 illustrates a network block diagram of a power generation system with a condition-based monitoring (CBM) intelligent electronic device (IED) in accordance with one embodiment.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

A power generation system may include a genset. A genset is a combination of a prime mover that generates mechanical energy and a synchronous machine such as a generator that converts the mechanical energy to electrical energy. Prime movers (e.g., reciprocating engines, gas turbines, steam turbines, water turbines, etc.) require significantly more maintenance than generators. This is because of the complexity and number of moving parts. Thus, a genset may be periodically removed from operation to perform preventative maintenance on the engine. However, the engine may not actually need maintenance at that time and therefore the preventative maintenance may cause unnecessary downtime. Conversely, if a problem is not detected while the genset is in operation, the problem may evolve into a larger issue that is more costly and time consuming to fix and may result in a larger downtime. Thus, ineffective indicators of when machine maintenance is required may cause premature maintenance and failures that could have been prevented. Active monitoring of a genset provide a better indication of when maintenance is needed.

Additionally, there is a large industry need for accurate models of electrical generation facilities. This is a notoriously difficult task to maintain accurate models. For example, the model may change for a variety of reasons including introduction of new equipment, age of the equipment, and fuel used. A real time model that is updated during operation may provide a more accurate model that reflects changes to electrical generation systems.

Additionally, condition monitoring algorithms run on an IED adjacent to the genset automatically detect conditions which require immediate or near term genset shutdown. In facilities with multiple gensets, CBM are used by systems to reprioritize which genset is started and or stopped, and at what time. These schemes act as predictive genset protection by preventing catastrophic failures before a damaging event occurs. Conventional protective systems today respond after the failures occur.

The present disclosure provides systems, methods, and apparatuses to actively monitor a genset and use operational measurements to build a continuously accurate real time model. By actively monitoring the genset, a system may know when a machine should be derated or recalibrated, indication of when a machine is operating at its peak efficiency (e.g., EPA rating validated), determine if a machine power system stabilizer (PSS) is operating correctly, or determine if a mechanical droop line is still within calibration.

Actively monitoring a genset refers to taking measurements of the genset while in use. The described systems, methods, and apparatuses allow the genset to be used in an electrical generation system while a model of the genset is being generated and or updated. Such models may be used as a control model. A genset controller may use a control model to determine parameters to control the genset. By continually updating the model, a system herein may adapt a genset response to better compensate for a response to a load change.

The phrases "coupled to," "connected to," and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, engine controllers, automatic voltage regulators, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Aspects of certain embodiments described herein may be implemented as software modules or components. As used herein, a software module or component may include any type of computer instruction or computer-executable code located within or on a computer-readable storage medium, such as a non-transitory computer-readable medium. A software module may, for instance, comprise one or more physical or logical blocks of computer instructions, which may be organized as a routine, program, object, component, data structure, etc., that perform one or more tasks or implement particular data types, algorithms, and/or methods.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network, or a cloud computing scheme. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In addition, the steps of a method do not necessarily need to be executed in any specific order, or even sequentially, nor need the steps be executed only once, unless otherwise specified.

FIG. 1 illustrates a network block diagram of a power generation system 100 with a CBM IED 114 in accordance with one embodiment. Note that in some embodiments CBM IED 114, controller 116, and protection IED 124 may be the same IED. The power generation system 100 includes a prime mover 102 and a generator 104 coupled with a shaft 106. While the illustrated embodiment includes the prime mover 102 and the generator 104, the CBM IED 114 may be used with any synchronous machine driven by a prime mover, or a synchronous machine acting as a motor. The CBM IED 114 may be applied to any rotating machine interface or magnetic interface to an electrical power system, such as an interface of a flywheel, a diesel rotary uninterruptible power supply (DRUPS) device, a wind turbine, a synchronous, induction, or reluctance motor, or a synchronous condenser.

A plurality of sensors (e.g., prime mover sensors 118, shaft sensors 122, generator sensors 120) may obtain a plurality of electrical and mechanical measurements of different aspects of the power generation system 100. The prime mover sensors 118 may collect measurements related to the prime mover 102. The generator sensors 120 may collect measurements related to the generator 104. And the shaft sensors 122 may collect measurements related to the shaft 106. For example, the sensors may measure shaft speed, torque, stator voltage, field voltage, field current, oil pressure, oxygen content, multi-axis vibrations, coolant temperature, stator voltage, stator current, stator magnetic field, electrical power output by the generator, mechanical power output by the engine, ambient temperature, and mechanical power of the prime mover. Thus, the sensors may obtain engine measurements from the prime mover 102 (which may include direct speed measurements and mechanical power, and other mechanical measurements), as well as generator field current, voltage and stator voltage, current measurements, and other electrical measurements. In some embodiments, the sensors may include analog engine position sensors, such as a synchro, resolver, encoder, or other rotational position measuring device attached to an engine, generator, or motor. In some embodiments, the sensors may include temperature probes, pressure probes, torque dynamometers, optical equipment, and flux probes.

In some embodiments the sensors may include one or more sensors to measure or use indirect measurements of other parameters to calculate shaft torque in real time. In some embodiments, the torque sensor may include one or more flux sensors. For instance, the sensors may include a flux sensor to obtain flux measurements within a generator air gap of a prime mover. The flux sensor or the CBM IED 114 may obtain torque measurements from the flux measurements as described with reference to FIG. 2. In some embodiments, the torque sensor or CBM IED 114 may use electrical power, frequency, engine fuel consumption, field current, stator voltage, shaft strain, coupler deflection, and rate of change of revolutions per minute (RPM) to determine torque as described with reference to FIG. 2. The sensors may provide the measurements to the CBM IED 114

In some embodiments, a controller 116 of the power generation system 100 may provide mechanical and electrical data. The controller 116 may be an engine control unit (ECU) or fuel injection controller. The controller 116 may track one or more of fuel packets, torque, and input power for the prime mover 102. The controller 116 may include an interface to provide the one or more of fuel packets, torque, and electrical power to the CBM IED 114 during operation of the prime mover 102.

The CBM IED 114 receives the mechanical and electrical measurements from the sensors and the data from the controller 116 and estimates control model parameters of the power generation system 100. The measurements and data may be obtained during operation when the power generation system 100 is being used to provide power. The real world measurements provide accurate data that can be used to estimate the control model parameters. The control model parameters may include rotor inertia, stator heat disputation coefficients, fuel valve to power correlation curve, generator excitation response, generator saturation curves, and machine fuel efficiency curves. The control model parameters can be tracked over time and used to provide a maintenance indicator to operators, update parameters used by the controller 116 in controlling the prime mover 102, and update parameters used by the protection IED 124 to protect the prime mover 102. Measurements from the sensors may be used by the CBM IED 114 to provide a real time model of the prime mover 102, generator 104, and a load.

In some embodiments, the CBM IED 114 may generate the model of the power generation system 100 from the control model parameters. For example, the CBM IED 114 may determine relationships between measurements and populate a model of the power generation system 100. In some embodiments, the relationships between components of the power generation system 100 may be derived from an imported machine model previously established. The CBM IED 114 may use the measurements to update the machine model to provide a more accurate model. For example, the CBM IED 114 may extrapolate a relationship between measurements to determine an estimated parameter. Parameters of a model may be referred to as correlation curves or simply curves. The correlation curves represent how a change of one measurement will affect a change of another measurement. When the CBM IED 114 detects a deviation of the estimated curves from established model curves (established curves may be generated by previous measurements or a machine model), the CBM IED 114 may indicate either a modeling error or potential maintenance issue. If there is a modeling error, the CBM IED 114 may update the parameters (e.g., correlation curve) according to the new measurements.

The CBM IED 114 may be in communication with the controller 116. The controller 116 may control the response of the power generation system 100 to a change in the load. To control the power generation system 100, the controller 116 may use a model of the power generation system 100 or parameters of the model. To increase the accuracy of the control, the CBM IED 114 may provide a model to the controller 116 that the CBM IED 114 generated or updated using real time operational measurements. The CBM IED 114 may periodically or continuously provide the controller 116 with updated parameters or an entire model. In some embodiments, the CBM IED 114 sends parameters or the model to the controller 116 after the CBM IED 114 detects a deviation and updates the model based on the deviation. Because the model the controller 116 is using is updated based on operational measurements, the controller 116 may more accurately control the power generation system 100.

The CBM IED 114 may be in communication with the protection IED 124, or may be the same device. The protection IED 124 detects faults in the load or power generation system 100 and prevents damage to the power generation system 100 from the fault. The protection IED 124 may include breakers, relays, and/or other electrical, mechanical, or electromechanical devices. In some embodiments, the protection IED 124 may provide arc flash detection and protection. To protect the power generation system 100, the protection IED 124 may use a model of the power generation system 100 or parameters of the model. To increase the accuracy, the CBM IED 114 may provide a model the protection IED 124 that the CBM IED 114 generated or updated using real time operational measurements. The CBM IED 114 may periodically or continuously provide the protection IED 124 with updated parameters or an entire model. In some embodiments, the CBM IED 114 sends parameters or the model to the protection IED 124 after the CBM IED 114 detects a deviation and updates the model based on the deviation. Because the model the protection IED 124 is using is updated based on operational measurements, the protection IED 124 may more accurately protect the power generation system 100. For example, changes in the correlation curves can indicate that various aspects of the power generation system 100 be derated. This information may be determined or provided to the protection system to prevent machine damage.

While the illustrated embodiment includes a separate CBM IED 114, controller 116, and protection IED 124, in some embodiments two or all three IEDs may be combined into a single IED.

The CBM IED 114 may also identify a deviation between electrical measurements or mechanical measurements and a correlation curve parameter representing a relationship between two measurements in the model. When the deviation is detected, the CBM IED 114 may provide a maintenance indicator based on the deviation. In some embodiments, the maintenance indicator may include a description of the discrepancy, one or more potential causes for the discrepancy, and a recommended maintenance procedure. In some embodiments, the maintenance indicator may be displayed on a human media interface (HMI) on the CBM IED 114. In some embodiments, the maintenance indicator may be transmitted over a network 112 to a separate device (e.g., a client device 108 or a personal electronic device (PED) 110).

Figure 2:
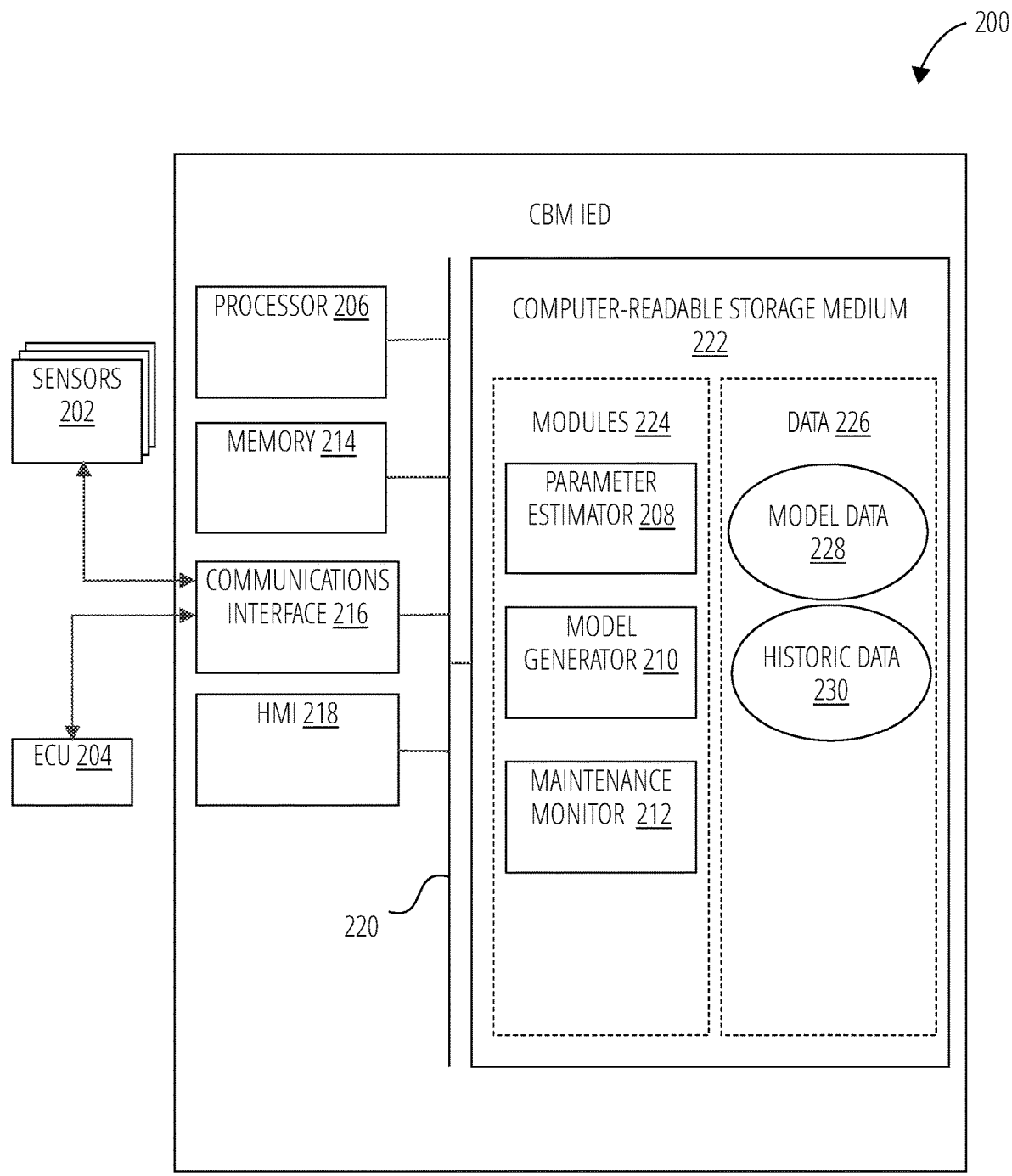
FIG. 2 is a functional block diagram of a CBM IED, according to one embodiment.

FIG. 2 is a functional block diagram of a CBM IED 200, according to one embodiment. The CBM IED 200 illustrates one possible embodiment of the CBM IED 114 of FIG. 1. As illustrated in FIG. 2, the CBM IED 200 may comprise a computer-readable storage medium 222, a processor 206, memory 214, a communications interface 216, an HMI 218, and a bus 220 to interconnect the components.

In various embodiments, the processor 206 may perform tasks such as computing, compiling, and/or executing computer executable instructions. The processor 206 may include one or more general purpose devices, such as an Intel®, AMD®, or other standard microprocessor. The processor 206 may include a special purpose processing device, such as ASIC, SoC, SiP, FPGA, PAL, PLA, FPLA, PLD, or other customized or programmable device. The processor 206 may perform distributed (e.g., parallel) processing to execute or otherwise implement functionalities of the present embodiments. The processor 206 may run a standard operating system and perform standard operating system functions. It is recognized that any standard operating systems may be used, such as, for example, Microsoft® Windows®, Apple® MacOS®, Disk Operating System (DOS), UNIX, IRIX, Solaris, SunOS, FreeBSD, Linux®, ffiM® OS/2®, and so forth.

The communications interface 216 may communicate with various sensors 202, controllers (e.g., ECU 204), protection systems, PEDs, client devices, external computers, and/or external or internal processors or IEDs. Also, the communications interface 216 may receive measurements and data from the sensors 202 and the ECU 204. The communications interface 216 may facilitate communication or other interaction with other computing devices and/or networks, such as the Internet and/or other computing and/or communications networks. The communications interface 216 may be equipped with conventional network connectivity such as, for example, Ethernet (IEEE 802.3), Token Ring (IEEE 802.5), Fiber Distributed Datalink Interface (FDDI), or Asynchronous Transfer Mode (ATM). Further, the communications interface 216 may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Modbus, DNP, IEC61850 GOOSE, Canbus, Secure Shell (SSH), Secure Socket Layer (SSL), and so forth. Further, the communication interface may include any serial protocols using a IAE 232, 485, or other similar physical layer. The communications interface 216 may be any appropriate communication interface for communicating with other systems and/or devices.

The sensors 202 may comprise various sensors such as analog engine position sensors, synchro, resolver, encoder (or other rotational position measuring device attached to an engine, generator, or motor), temperature probes, pressure probes, torque dynamometers, optical equipment, strain probes, linear distance probes, current probes, and flux probes. For example, one of the sensors may be a torque measurement device to obtain torque measurements. The torque measurement device may measure other parameters that may be used to calculate torque such as flux, electrical power, frequency, and rate of change of RPM. In some embodiments, the torque measurement device may be a flux sensor.

The ECU 204 may control a power generation system. Additionally, the ECU 204 may include a valve for controlling fuel delivery to a prime mover 102, and processing circuitry to track one or more of fuel packets, torque, and input power for the prime mover 102. The ECU 204 may include an interface to communicate with the communications interface 216 and provide the one or more of fuel packets, torque, and electrical power to the CBM IED 200.

The memory 214 and/or the computer-readable storage medium 222 may be any piece of hardware capable of storing information such as data, computer programs, and/or other suitable information. The memory 214 may include volatile memory and/or non-volatile memory, and may be fixed or removable. The memory 214 may include RAM, ROM, a hard drive, a flash memory, a thumb drive, an optical disk, a magnetic tape, or some combination of the above. In one embodiment, the memory 214 may be used to store instructions to be executed by the processor 206.

The computer-readable storage medium 222 may be a non-transitory memory device, according to one embodiment, and include any number of modules 224 for performing tasks for condition-based monitoring of a power generation system. The modules 224 may run multiple operations concurrently or in parallel by or on the processor 206. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, subsystems and/or the like.

The computer-readable storage medium 222 may also include the data 226. Data generated by the CBM IED 200, such as by the modules 224 or other modules, may be stored on the computer-readable storage medium 222, for example, as stored program data 226. The data 226 may be organized as one or more databases. For example, the data 226 may include model data 228 generated by the modules 224. The model data 228 may include correlations between various components of a power generation system. Additionally, the data 226 may include historic data 230 that may include measurements received from the sensors 202 and input from the ECU 204 over a period of time. The modules 224 may use the historic data 230 to develop a model and to identify deviations of the power generation system from the model.

The modules 224 may include a parameter estimator 208, a model generator 210, and a maintenance monitor 212. The parameter estimator 208 may receive measurements from the sensors 202 and input from the ECU 204, filter these received measurements and inputs, and determine a relationship or correlation between various measurements and inputs. The measurements may be static such as voltage, speed, current, or the measurements may be dynamic such as change to rotor inertia. The correlation may be a correlation curve, static parameters, and/or a state or transfer function. The correlations that the parameter estimator 208 determines may be used by the model generator 210 as parameters to generate a model. To determine these parameters, the parameter estimator 208 may generate a table comparing mechanical parameters and electrical parameters. For example, the parameter estimator 208 may generate a table comparing fuel valve position to an electrical power output. From this table, the parameter estimator 208 may extrapolate a relationship (e.g., a function or correlation curve). The parameter estimator 208 may continuously or periodically update the table using measurements taken during use of the power generation system and adjust the extrapolated relationship based on the operational measurements. The operational measurements may be used by the parameter estimator 208 as feedback to update the table or correlation curve to more accurately estimate the parameters of a model of the power generation system.

The model generator 210 receives the parameters from the parameter estimator 208 and maps the parameters to a model of the power generation system. The model generator 210 may provide a visual model to a user through the HMI 218. In some embodiments, the model generator 210 may transmit the model with the parameters via the communications interface 216. In some embodiments, the model generator 210 may update an imported machine model previously established. In some embodiments, the model generator 210 may create the model without an imported machine model.

The maintenance monitor 212 may monitor input from the sensors 202 and the ECU 204 and compare the input to the model. The maintenance monitor 212 may determine deviations between the measurements and the model and provide an alert that maintenance is needed. In some embodiments, to determine the deviation, the maintenance monitor 212 may compare a difference between an expected value from the model and the measurement to a threshold. In some embodiments, the maintenance alert may identify the model variable and a recommended maintenance procedure. In some embodiments, the maintenance monitor 212 may identify a modeling error based on the discrepancy. The maintenance monitor 212 may alert the parameter estimator 208 and/or a user to the discrepancy. In some embodiments, the maintenance monitor 212 may determine that the discrepancy exceeds a safe operational threshold and transmit a signal to a protection system (e.g., a breaker) to cause the power generation system to cease operation.

The following includes several examples of how the modules 224 may generate a model and use that model to detect maintenance issues. For example, during operation the CBM IED 200 can maintain a curve/table relating steady state power with fuel valve position. Deviations from the relationship between steady state power and fuel valve position could indicate variations in BTU rating of the fuel or wear in the fuel valve or fuel valve actuator. Thus, the maintenance monitor 212 may generate a maintenance alert indicating fuel valve or fuel valve actuator maintenance is needed.

Similarly, the CBM IED 200 may receive a fuel valve position, a fuel packet measurement, and an electrical power output by the prime mover. The CBM IED 200 may identify a deviation between the historical relationship between the fuel valve position, fuel packets, and the electrical power output by the prime mover to a present relationship between the fuel valve position and the electrical power output by the prime mover. Based on the deviation, the maintenance monitor 212 may generate a maintenance indicator identifying one or more of fuel British thermal unit (BTU) discrepancy, valve wear, and valve actuator wear.

In some embodiments, a vibration and/or acoustic monitoring system could maintain a distribution of normal rms values for the vibration at a variety of power levels. Statistically significant increases in the rms of the vibration may indicate transition from normal to a degraded stage.

In some embodiments, a more sophisticated vibration and/or acoustic monitoring system could maintain not just the rms value, but also the power spectral density at a variety of power levels. A change in the shape of the power spectral density (even if rms remains constant) can indicate subtle changes on the machine condition that may predict failures. The vibro-acoustic summary values from the vibration and/or acoustic monitoring system may be compared to shaft speed and power output to develop a model (e.g., correlation) and may allow the CBM IED 200 to predict the vibro-acoustic values as functions of shaft speed and power output. A more refined model might take shaft position into account as well. Deviation of the measured vibro-acoustic values to the predictions could indicate problems relating to degraded bearing condition, degraded lubrication, machine imbalance, exhaust gas leakage, fuel flow restrictions, exhaust flow restrictions, among other problems.

For example, first set of sensors measure shaft speed and shaft position, the second set of sensors measure terminal voltage and current, the third set of sensors measure mechanical vibration, and the fourth set of sensors measure acoustic signals. A CBM IED 200 may perform analysis on data from the third set of sensors and fourth set of sensors to extract key parameters which are then correlated with shaft speed (and optionally shaft position) and operating power to build a model by which expected vibration and acoustic parameters can be calculated from shaft speed and power level. Further, the CBM IED 200 may identify a deviation of measured values from the model, the maintenance indicator identifies one or more of degraded bearing condition, degraded lubrication, machine imbalance, exhaust gas leakage, fuel flow restrictions, exhaust flow restrictions, among other problems.

In some embodiments, the CBM IED 200 may receive shaft speed, stator voltage, field voltage, and field current. The CBM IED 200 may use the model generated by the model generator 210 to compare a historical relationship between the stator voltage and one or more of the shaft speed, field voltage, and field current to a present relationship between the stator voltage and one or more of the shaft speed, field voltage, and field current. Based on that deviation, the maintenance monitor 212 may generate a maintenance indicator that identifies one or more of a turn-to-turn fault, insulation degradation, shaft alignment issue, and excitation rectifier issues.

In some embodiments, the CBM IED 200 may receive coolant temperature, electrical power output by the prime mover 102, shaft speed, and ambient temperature. The CBM IED 200 may use the model generated by the model generator 210 to compare a historical relationship between the coolant temperature and one or more of the electrical power output by the prime mover, the shaft speed, and the ambient temperature to a present relationship between the coolant temperature and one or more of the electrical power output by the prime mover and the shaft speed. Based on that deviation, the maintenance monitor 212 may generate a maintenance indicator that identifies one or more of an air obstruction, a coolant issue, a winding resistance issue, and an operating outside of elevation envelope issue.

In some embodiments, the CBM IED 200 may receive shaft speed, electrical power output by the prime mover, mechanical power of the prime mover, and a change to rotor inertia. Based on that deviation, the maintenance monitor 212 may generate a maintenance indicator that identifies one or more of a change to rotor inertia, a change to system inertia, and an error in shaft speed measurements.

In some embodiments, the CBM IED 200 may probe the power generation system with pre-calculated induced transients to capture dynamic measurements. For example, in some embodiments, during a change in load for the first 100 milliseconds the CBM IED 200 may use the change in frequency over time (Df/Dt) to measure inertia (H) and after the power generation system reaches steady state the CBM IED 200 may use a locked fuel valve test to determine load composition.

The CBM IED 200 may model the load to determine parameters of the power generation system that may be used to predict a response of the power generation system to a load. The load modeling may be done during operation of the power generation system. Continuous online load parameter modelling (i.e., load composition measurement) may be performed by the CBM IED 200 using a partial differential technique shown below.

For an isolated power generation system, the load model may be represented by:

$$P_e(t) = \left(\frac{dP}{df}\right)\Delta F + \left(\frac{dP}{dv}\right)\Delta v + P_{static}$$

where:
Pe(t) is electrical power consumed by the load and output by the generator,
$P_{static}$ is the static component of the load model, not affected by frequency or voltage.
dP/df is a sensitivity factor indicating the change in P as a result of a change in frequency (F)~16*%/1%, and
dP/dv is a sensitivity factor indicating the change in P as a result of a change in voltage (v)~(% resistive compensation)*2, For a grid connected power generation system the load model may be represented by:

$$P_e(t) = \frac{E_s V_{TH}}{Z_{TH}} \sin(\delta_s - \delta_{TH}) + P_{static}$$

Where:
Pe(t) is a generator load model based on Thevenin equivalent model of the connection to the bulk electrical grid.
$Z_{TH}$ is the Thevenin equivalent impedance to the ideal source.
$V_{TH}$ is the ideal Thevenin equivalent voltage across some impedance Zth
$\delta_{TH}$ is the voltage angle of the Thevenin equivalent voltage source
$E_s$ is the generator voltage magnitude
$\delta_s$ is the generator voltage angle $P_{static}$ is the static component of the load model, not affected by frequency or voltage. Being grid connected implies that frequency and voltage are constant.

For a combined (isolated and grid connected) power generation system the load model may be represented by:

$$P_e(t) = \frac{E_s V_{TH}}{Z_{TH}} \sin(\delta_s - \delta_{TH}) + \left(\frac{dP}{df}\right)(\Delta\delta\_\text{dot}) + \left(\frac{dP}{dv}\right)(\Delta E_s)$$

Where:
$\Delta\delta$_dot is the deviation from nominal of the system rate of change of angle.
$\Delta E_s$ is the deviation from nominal generator voltage magnitude
$\delta_s$ is the generator voltage angle
$\delta_{TH}$ is the voltage angle
ZTH is the impedance between the stator terminal and VTH.

The online load composition modeling (i.e., modeling the load while the power generation system is online) may be used to assist a controller in controlling the generator as it improves the ability to predict the power generation system response. The power generation system response is dependent on both the power generation system and an attached network (other power generating machines, loads, etc.). When responding to a severe transient, the controller can adapt a response of the power generation system to better compensate for the overall system response. An accurate model provided by the CBM IED 200 may cause the power generation system to respond better to changes in the load. For example, the CBM IED 200 may model a mechanical droop line adjustment and provide the mechanical droop line adjustment to the ECU 204.

The CBM IED 200 may identify load response via passive measurements. In some embodiments, the CBM IED 200 may improve on the passive techniques by periodically probing the network with pre-calculated induced transients (e.g., voltage reference change, frequency change), predicting the response, and comparing the prediction to the measured response. In some embodiments, the CBM IED 200 can coordinate these probes between other machines (e.g., power generation systems) with other CBM IEDs to provide a richer dataset of responses. Induced transients may be coordinated between CBM IEDs and data from the transients are shared between CBM IEDs as described in U.S. Pat. No. 10,833,507.

In some embodiments, the CBM IED 200 may measure engine torque as part of the model. For example, the CBM IED 200 may measure engine torque using electrical power, frequency, and rate of change of RPM. The CBM IED 200 may calculate torque as:

$$T_m = \frac{P_e}{f} - H\Delta\dot{\delta}$$

where:
$T_m$ represents torque,
$P_e$ represents electrical power,
f represents frequency,
H represents inertia, and
$\Delta\dot{\delta}$ represents the change ($\Delta$) of the rotations per minute.

This torque measurement could be used by the CBM IED 200 to improve engine performance and reduce emissions via the controller. Additionally, the CBM IED 200 may monitor torque as a condition to determine maintenance issues and cause protection systems to trip. Turbines, couplings, windings, and housings all are damaged by torque surges. Thus, the CBM IED 200 may detect torque surges with the torque measurements and send a signal to a protection system to prevent harm to the power generation system.

For mechanical fuel injected machines, the fuel flow sensors are a real challenge and may prevent these measurements. Thus, the CBM IED 200 may implement other methods for estimating torque for these machines. For example, a fuel injection controller (e.g., ECU 204) may provide direct fuel packet measurements to the CBM IED 200. The fuel injection controller may include a valve for controlling fuel delivery to a prime mover, and processing circuitry to track one or more of fuel packets, torque, and input power for the prime mover. The fuel injection controller may also include an interface to the fuel injection controller. The interface can be used to provide the one or more of fuel packets, torque, and electrical power to the CBM IED 200 during operation of the prime mover. For example, in some embodiments the fuel injection controller can provide a detailed measurement stream to the CBM IED 200 (e.g., IEEE C37.118 protocol stream for data coming from the device).

In some embodiments, the CBM IED 200 may estimate the torque using a flux sensor to obtain flux measurements within a generator air gap of a prime mover. The CBM IED 200 may estimate the torque measurements from flux and other measurements. For example, torque may be estimated by flux from rotor multiplied by flux from stator multiplied by the load angle. In some embodiments, stator related flux is directly measured by the flux sensor, in others it is estimated by real time monitoring of stator voltages, currents, and field excitation currents and shaft position. The CBM IED 200 may estimate rotor flux based upon speed, saturation curves, rotor position, and field current. The CBM IED 200 may measure load angle as the difference between engine tooth wheel, encoder, resolver, or other physical measurement and the stator voltage waveform. The CBM IED 200 may use deviations from an expected flux or torque to identify problems with: harmonics in the flux (may indicate pole winding problem), sub-synchronous magnitude variations (may indicate an automatic voltage regulator (AVR) issue, excessive carbon brush wear/hopping), flux transients (may indicate AVR problems), or flux saturation.

Figure 3:
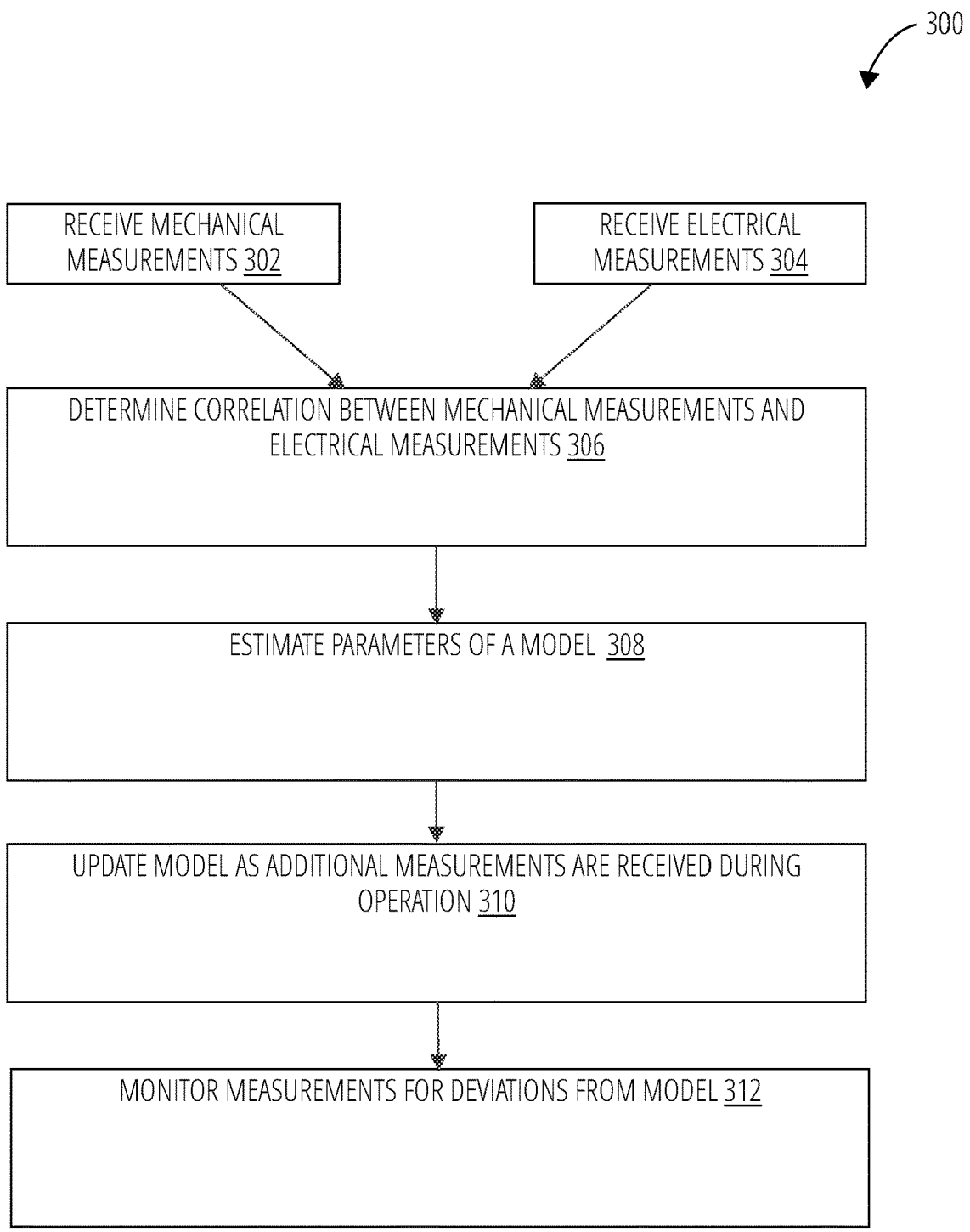
FIG. 3 is a flow chart of a method for modeling a power generation system in accordance with one embodiment.

FIG. 3 is a flow chart of a method 300 for modeling a power generation system in accordance with one embodiment. A CBM IED may perform this method 300 to model a power generation system and provide maintenance alerts. The CBM IED may receive 302 mechanical measurements and receive 304 electrical measurements while the power generation system is in operation supplying power to a load. Collecting data during operation reduces downtime that would be needed to use a dyno to test the system.

The CBM IED may further determine 306 a correlation between mechanical measurements and electrical measurements. For example, the CBM IED may generate a table that compares an electrical measurement to a mechanical measurement as one or both measurements change. For example, the CBM IED may generate a table comparing fuel valve position to electrical power output.

The CBM IED may estimate 308 a parameter of a model of the power generation system based on the correlation and use the parameters to generate a model. For example, the CBM IED may use a correlation table as described above as a parameter to estimate a response to a change. In some embodiments the CBM IED may use the correlation of parameters to develop a dynamic model comprising a state space function or a transfer function. For example, the CBM IED may develop a first or second order dynamic model relating a fuel valve movement to the resulting transient in the electrical power output.

The CBM IED may update 310 the model as additional measurements are received during operation. After the model is generated, the CBM IED may continue to receive measurements and use those measurements to provide an increasingly accurate model. Additionally, the CBM IED may monitor 312 the measurements for deviations from the model and use that to issue a maintenance alert or correct the model. For example, if the deviation is below a threshold, the CBM IED may use the deviation to correct the model. However, if the CBM IED detects a deviation above the threshold, the CBM IED may generate a maintenance alert.

Figure 4:
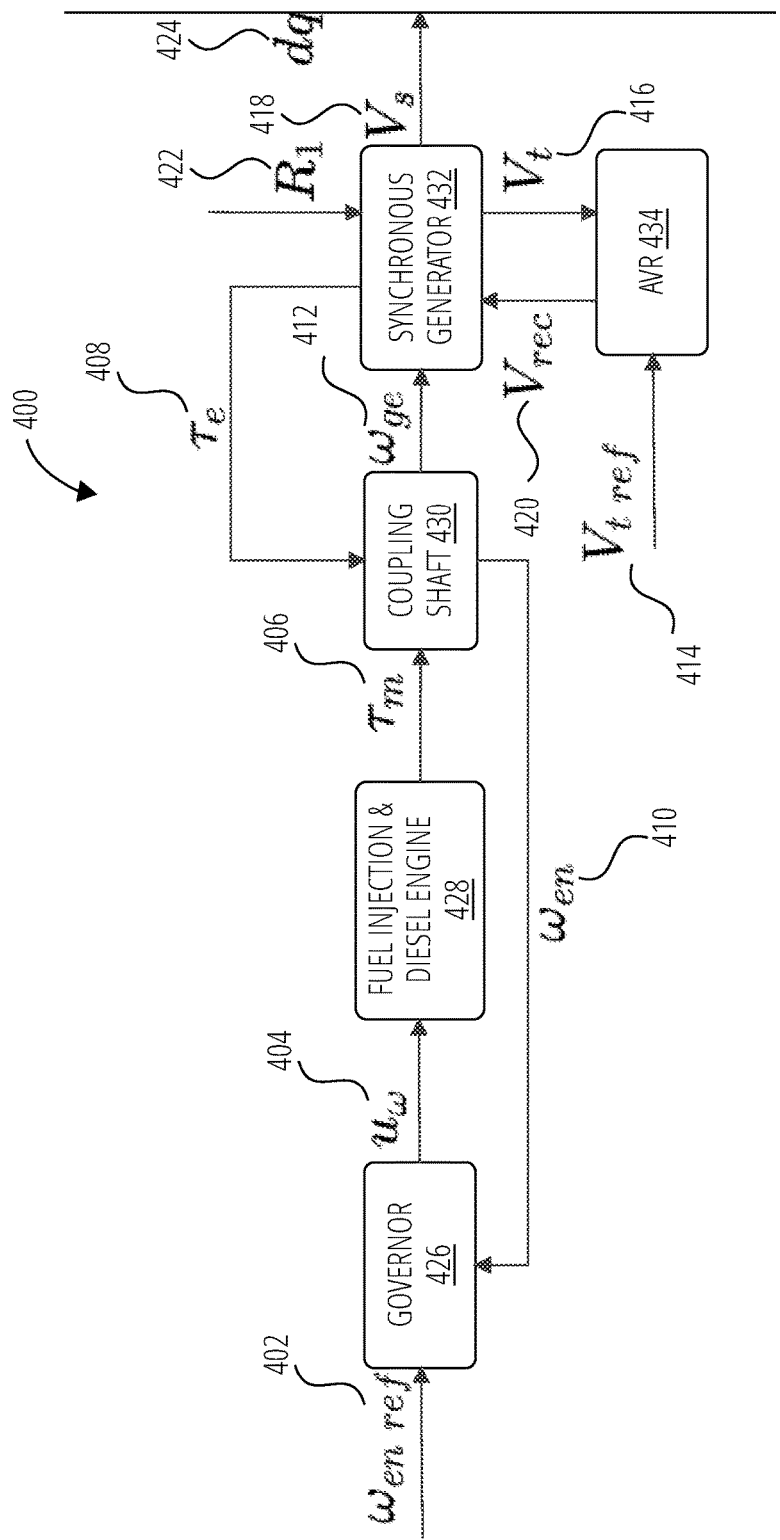
FIG. 4 illustrates a model 400 of a power generation system in accordance with one embodiment.

FIG. 4 illustrates a model 400 of a power generation system in accordance with one embodiment that may be generated using the method 300 of FIG. 3 by a CBM IED. Each of the parameters (e.g., $\omega_{en\ ref}$402, $u_\omega$404, $\tau_m$406, $\tau_e$408, $\omega_{en}$410, $\omega_{ge}$412, $V_{t\ ref}$414, $V_t$416, $V_s$418, $V_{rec}$ 420, $R_1$ 422, and dq424) in this model 400 may be generated by monitoring measurements during operation. Additionally, a CBM IED may update the parameters as future measurements are received. The parameters may be represented in a variety of ways including as a state space, transfer function, or a first or second order dynamic model.

In the illustrated embodiment, the model 400 includes components such as a governor 426, a fuel injection and diesel engine 428, a coupling shaft 430, a synchronous generator 432, and an AVR 434. The parameters represent inputs and outputs of the components. Thus, the model is able to estimate or predict changes to the outputs of the components and interactions between the components using the parameters.

In the illustrated example, the CBM IED uses sensor measurements to determine, monitor, and update the following parameters:

$\omega_{en\ ref}$402—speed reference for the genset engine governor $u_\omega$404—command signal from the governor to the fuel valve or ECU specifying desired fuel flow rate.

$\tau_m$406—mechanical torque from the engine to the genset alternator $\tau_e$408—electrical torque imposed on the generator by the electro-magnetic fields coupling it to the power grid $\omega_{en}$410—measured rotational speed of the genset $\omega_{ge}$412—frequency of the shaft rotation $V_{t\ ref}$414—voltage magnitude reference for the AVR to regulate the voltage at the genset terminal.

$V_t$416—voltage magnitude at the genset terminals $V_s$dq418—magnitude of the synchronizing voltage of the power grid decomposed by Park equations of a rotating frame reference $V_{rec}$420—Voltage applied by the AVR to the field windings of the generator.

$R_1$ 422—Generator model damping coefficient (consolidates various physical damping factors into a single coefficient)

The model 400 may be used to control the power generation system. For example, the model 400 may be used by a controller to accurately respond to transients or load changes and may also be used by a protection system. Additionally, a CBM IED may determine deviations between future measurements and the model and provide a maintenance alert.

Figure 5:
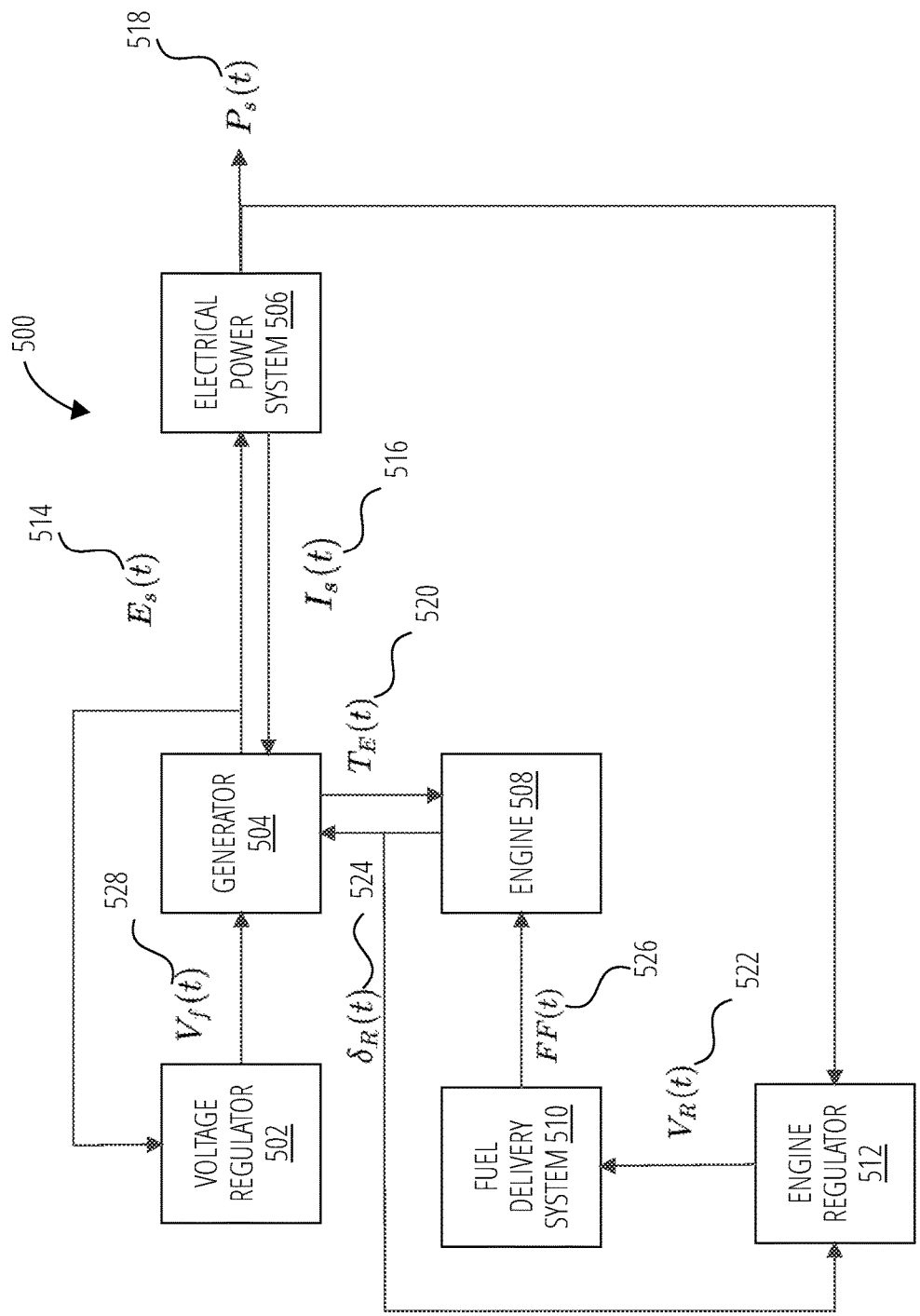
FIG. 5 illustrates a detailed model 500 of a power generation system in accordance with one embodiment.

FIG. 5 illustrates a detailed model 500 of a power generation system in accordance with one embodiment. The detailed model 500 may be generated using the method 300 of FIG. 3 by a CBM IED. As illustrated in some embodiments, the CBM IED may be used to develop additional parameter details for a model. This model may be kept up to date in real time using measurements taken by sensors during operation. The parameters of the detailed model 500 may be presented in the time domain using state-space techniques. An electrical power system 506 may include one or more power generation systems providing power to a set of loads.

The detailed model 500 is a block diagram with eight states or parameters. As can be appreciated, the CBM IED may be used to develop additional states or parameters for a more accurate model. The detailed model 500 includes a voltage regulator 502, a generator 504, electrical power system 506, an engine 508, a fuel delivery system 510, an engine regulator 512, and a set of parameters describing time domain states of the system. In the illustrated example, the CBM IED uses sensor measurements to determine, monitor, and update the following parameters:

$P_s(t)$ 518—electrical power out of stator, $E_s(t)$ 514—Thevenin back voltage of stator, quadrature units implied, $I_s(t)$ 516—stator current, quadrature, $V_f(t)$ 528—voltage out of voltage regulator, $T_E(t)$ 520—mechanical shaft torque created from rotor fluxes, $\delta_R(t)$ 524—rotor/engine shaft position, FF(t) 526—fuel flow, and $V_R(t)$ 522—voltage on fuel actuator.

These parameters may be updated and monitored as new operational measurements are received. The parameters may be a table, function, correlation curve, static parameters, and/or a state or transfer function that relates the individual parameter with other parameters. Thus, the model may be used to predict parameters of the power generation system based on an estimation or measurement of one or more other parameters.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A condition-based monitoring system to monitor a power generation system, the system comprising:
   a first set of sensors to obtain a plurality of mechanical measurements of a prime mover of the power generation system while the prime mover is in operation the prime mover providing mechanical energy to a synchronous machine;
   a second set of sensors to obtain a plurality of electrical measurements of the synchronous machine of the power generation system while the prime mover is in operation, the synchronous machine to convert the mechanical energy to electrical energy;
   a data storage device configured to store model data characterizing a model of the prime mover and the synchronous machine; and
   processing circuitry to:

receive the plurality of mechanical measurements and the plurality of electrical measurements, including electrical power, frequency, and shaft speed measurements;

calculate torque using the electrical power, frequency, and a rate of change of rotations per minute using the shaft speed measurements;

determine a correlation between one or more of the plurality of mechanical measurements and one or more of the plurality of electrical measurements;

estimate parameters of the model based on the correlation and the calculated torque;

generate the model using the estimated parameters; and continually update the model as the first set of sensors and the second set of sensors obtain additional measurements during operation of the prime mover wherein the torque is calculated as:

$$T_m = T_m = \frac{P_e}{f} - H\Delta\dot{\delta}$$

where:
$T_m$ represents torque,
$P_e$ represents electrical power,
f represents frequency,
H represents inertia, and
$\Delta\dot{\delta}$ represents a change of rotations per minute.

2. The condition-based monitoring system of claim 1, wherein the processing circuitry is further to:
identify a deviation between a correlated mechanical measurement and electrical measurement and the model; and
provide a maintenance indicator based on the deviation.

3. The condition-based monitoring system of claim 2, wherein the first set of sensors measure a fuel usage, and the second set of sensors measure electrical power output by the prime mover;
wherein to identify the deviation, the processing circuitry uses the model to compare a historical relationship between the fuel valve position and the electrical power output by the prime mover to a present relationship between the fuel valve position and the electrical power output by the prime mover;
wherein when the deviation is identified, the maintenance indicator identifies one or more of fuel British thermal unit (BTU) discrepancy, valve wear, and valve actuator wear.

4. The condition-based monitoring system of claim 2, further comprising:
a third sensor; and
a fourth sensor;
wherein the first set of sensors measure shaft speed, the second set of sensors measure stator voltage, the third sensor measures field voltage, and the fourth sensor measures field current;
wherein to identify the deviation, the processing circuitry uses the model to compare a historical relationship between the stator voltage and one or more of the shaft speed, field voltage, and field current to a present relationship between the stator voltage and one or more of the shaft speed, field voltage, and field current; and
wherein when the deviation is identified, the maintenance indicator identifies one or more of a turn-to-turn fault, insulation degradation, shaft alignment issue, and rectifier issue.

5. The condition-based monitoring system of claim 2, further comprising:
a third set of sensors; and
a fourth set of sensors,
wherein the first set of sensors measure shaft speed and shaft position, the second set of sensors measure terminal voltage and current, the third set of sensors measure mechanical vibration, and the fourth set of sensors measure acoustic signals,
wherein the processing circuitry is further to:
perform analysis on data from the third set of sensors and fourth set of sensors to extract key parameters which are then correlated with shaft speed and operating power to build a model by which expected vibration and acoustic parameters can be calculated from shaft speed and power level; and
identify a deviation of measured values from the model, the maintenance indicator identifies one or more of degraded bearing condition, degraded lubrication, machine imbalance, exhaust gas leakage, fuel flow restrictions, exhaust flow restrictions, among other problems.

6. The condition-based monitoring system of claim 2, further comprising:
a third sensor; and
a fourth sensor;
wherein the first set of sensors measure coolant temperature, the second set of sensors measure electrical power output by the prime mover, the third sensor measures shaft speed, and the fourth sensor measures ambient temperature;
wherein to identify the deviation, the processing circuitry uses the model to compare a historical relationship between the coolant temperature and one or more of the electrical power output by the prime mover, the shaft speed, and the ambient temperature to a present relationship between the coolant temperature and one or more of the electrical power output by the prime mover, the shaft speed, and the ambient temperature; and
wherein when the deviation is identified, the maintenance indicator identifies one or more of an air obstruction, a coolant issue, a winding resistance issue, and an operating outside of elevation envelope issue.

7. The condition-based monitoring system of claim 2, further comprising:
a third sensor;
wherein the first set of sensors measure shaft speed, the second set of sensors measure electrical power output by the synchronous machine, and the third sensor measures mechanical power of the prime mover;
wherein to identify the deviation, the processing circuitry uses the model to compare a historical relationship between the shaft speed and a difference between the electrical power and the mechanical power to a present relationship between the shaft speed and a difference between the electrical power and the mechanical power; and
wherein when the deviation is identified, the maintenance indicator identifies one or more of a change to rotor inertia, a change to system inertia, and an error in shaft speed measurements.

8. The condition-based monitoring system of claim 2, further comprising an interface to transmit the maintenance indicator to a protection system.

9. The condition-based monitoring system of claim 1, wherein the parameters comprise correlation curves between the plurality of mechanical measurements and the plurality of electrical measurements.

10. The condition-based monitoring system of claim 1, wherein the processing circuitry is further to maintain a table of correlated measurements.

11. The condition-based monitoring system of claim 1, wherein the model is a state space model relating the plurality of mechanical measurements and the plurality of electrical measurements.

12. The condition-based monitoring system of claim 1, wherein the model comprises a transfer function relating the plurality of mechanical measurements and the plurality of electrical measurements.

13. The condition-based monitoring system of claim 1, wherein the plurality of mechanical measurements and the plurality of electrical measurements are static measurements.

14. The condition-based monitoring system of claim 1, wherein the first set of sensors comprise an engine control unit providing data relating to fuel packets, torque, and input power.

15. The condition-based monitoring system of claim 1, wherein the first set of sensors comprise a flux sensor, and wherein the processing circuitry is further to determine torque based on a flux measurement.

16. The condition-based monitoring system of claim 1, wherein the processing circuitry is further to:
periodically probe the prime mover with a pre-calculated induced transient;
predict a response of the prime mover to the pre-calculated induced transient using the model;
compare the predicted response to a measured response; and
update the model based on a comparison result.

17. The condition-based monitoring system of claim 1, wherein the processing circuitry is further to control the prime mover based on the model.

18. A condition measurement device comprising:
a fuel injection controller comprising:
a valve for controlling fuel delivery to a prime mover the prime mover providing mechanical energy to a synchronous machine for conversion to electrical energy, and
processing circuitry to track fuel packets, torque, and input power for the prime mover;
an interface to the fuel injection controller, the interface to provide the fuel packets, torque, and electrical power to a condition-based monitoring device during operation of the prime mover;
wherein the processing circuitry is configured to calculate the torque as:

$$T_m = \frac{P_e}{f} - H\Delta\dot{\delta}$$

where:
$T_m$ represents torque,
$P_e$ represents electrical power,
f represents frequency,
H represents inertia, and
$\Delta\dot{\delta}$ represents a change of rotations per minute.

19. A condition-based monitoring system to monitor a power generation system, the system comprising:
an input for receiving electrical power, frequency, and shaft speed measurements;
a torque measurement device to calculate torque measurements using the received electrical power, frequency, and a rate of change of rotations per minute using the shaft speed measurements; and
processing circuitry in communication with the torque measurement device, the processing circuitry to:
receive the torque measurements;
estimate a torque parameter of a model of a prime mover the prime mover providing mechanical energy to a synchronous machine;
identify a deviation between the torque parameter and a present torque measurement; and
provide a maintenance indicator based on the deviation
wherein the torque measurement device calculates the torque as:

$$T_m = \frac{P_e}{f} - H\Delta\dot{\delta}$$

where:
$T_m$ represents torque,
$P_e$ represents electrical power,
f represents frequency,
H represents inertia, and
$\Delta\dot{\delta}$ represents a change of rotations per minute.

* * * * *